United States Patent
Lu (10) Patent No.: US 11,374,027 B2
(45) Date of Patent: Jun. 28, 2022

(54) MANUFACTURING METHOD OF THIN FILM TRANSISTOR SUBSTRATE AND THIN FILM TRANSISTOR SUBSTRATE

(71) Applicant: Shenzhen China Star Optoelectronics Semiconductor Display Technology Co., Ltd., Shenzhen (CN)

(72) Inventor: Macai Lu, Shenzhen (CN)

(73) Assignee: Shenzhen China Star Optoelectronics Semiconductor Display Technology Co., Ltd., Shenzhen (CN)

( * ) Notice: Subject to any disclaimer, the term of this patent is extended or adjusted under 35 U.S.C. 154(b) by 280 days.

(21) Appl. No.: 16/620,515

(22) PCT Filed: Jul. 18, 2019

(86) PCT No.: PCT/CN2019/096604
§ 371 (c)(1),
(2) Date: Dec. 8, 2019

(87) PCT Pub. No.: WO2021/003767
PCT Pub. Date: Jan. 14, 2021

(65) Prior Publication Data
US 2021/0366943 A1    Nov. 25, 2021

(30) Foreign Application Priority Data
Jul. 5, 2019    (CN) .......................... 201910605723.7

(51) Int. Cl.
*H01L 27/00*    (2006.01)
*H01L 29/00*    (2006.01)
(Continued)

(52) U.S. Cl.
CPC ........ *H01L 27/1225* (2013.01); *H01L 27/127* (2013.01); *H01L 29/7869* (2013.01)

(58) Field of Classification Search
CPC ............... H01L 27/1225; H01L 27/127; H01L 27/3276; H01L 27/3265; H01L 29/7869;
(Continued)

(56) References Cited

U.S. PATENT DOCUMENTS 9,620,613 B2 *   4/2017  Park .................... H01L 29/4908
10,418,431 B2 *  9/2019  Park .................... H01L 51/5256
(Continued)

*Primary Examiner* — Nikolay K Yushin (57) ABSTRACT

A manufacturing method of a thin film transistor substrate and a thin film transistor substrate are provided. In the manufacturing method of the thin film transistor substrate, a buffer layer, a metal oxide semiconductor layer, and a first insulating layer are sequentially deposited on a substrate, and then the first insulating layer and the metal oxide semiconductor layer are patterned according to a pattern of an active layer. The metal oxide semiconductor layer forms the active layer. A second insulating layer and a gate metal layer are then sequentially deposited. The first insulating layer and the second insulating layer together form a gate insulating layer. The first insulating layer can be used to protect the metal oxide semiconductor layer, such that defects on a contact surface between the active layer and the gate insulating layer are reduced, thereby improving the stability of a device.

5 Claims, 6 Drawing Sheets (51) Int. Cl.
*H01L 27/12* (2006.01)
*H01L 29/786* (2006.01)

(58) Field of Classification Search
CPC ... H01L 29/518; H01L 29/4908; H01L 29/49; H01L 29/42384; H01L 29/66969
See application file for complete search history.

(56) References Cited

U.S. PATENT DOCUMENTS

2016/0020266 A1* 1/2016 Park .................... H01L 29/4908
  257/40
2017/0221976 A1* 8/2017 Park ..................... H01L 27/326

* cited by examiner providing a substrate, and sequentially depositing a buffer layer, a metal oxide semiconductor layer, and a first insulating layer on the substrate, and patterning the first insulating layer and the metal oxide semiconductor layer according to a pattern of an active layer, where the metal oxide semiconductor layer forms the active layer — S1 sequentially depositing a second insulating layer and a gate metal layer on the first insulating layer and the buffer layer, and patterning the gate metal layer, the second insulating layer, and the first insulating layer, where the gate metal layer forms a gate, and the first insulating layer and the second insulating layer together form a gate insulating layer below the gate — S2

MANUFACTURING METHOD OF THIN FILM TRANSISTOR SUBSTRATE AND THIN FILM TRANSISTOR SUBSTRATE

RELATED APPLICATIONS

This application is a National Phase of PCT Patent Application No. PCT/CN2019/096604 having International filing date of Jul. 18, 2019, which claims the benefit of priority of Chinese Patent Application No. 201910605723.7 filed on Jul. 5, 2019. The contents of the above applications are all incorporated by reference as if fully set forth herein in their entirety.

FIELD AND BACKGROUND OF THE INVENTION

The present disclosure relates to the field of display technologies, and in particular, to a manufacturing method and a thin film transistor substrate of a thin film transistor substrate.

Thin film transistors (TFTs) are main driving elements in flat display devices such as liquid crystal display devices (LCDs), organic light-emitting diode (OLED) display devices, and micro light-emitting diode (Micro LED) display devices. The thin film transistors are directly related to a development of high performance flat display devices. The thin film transistors have a variety of structures. There are also various materials for forming an active layer of the thin film transistor of a corresponding structure, where a metal oxide TFT, such as an indium gallium zinc oxide (IGZO) thin film transistor, has high field effect mobility ($\geq 10$ $cm^2/V \cdot s$). The thin film transistor has a simple preparation process, good uniformity of deposition over a large area, fast response, and high transmittance in a range of visible light. Therefore, the thin film transistors are considered to be the most promising backplane technology for large size and flexible displays. However, in order to improve an electrical property and stability of the metal oxide thin film transistor, a high temperature annealing process is required, which limits its application in flexibility.

For the metal oxide thin film transistor with a conventional bottom gate structure, due to an overlapping area of a gate and source and drain electrodes is large, a large parasitic capacitance is generated, which causes a delay of the signal. Moreover, a larger size of the transistor limits its application. For a self-aligned top gate structure, since there is no overlap between source and drain electrodes and a gate, it has lower parasitic capacitance and better ductility.

OLEDs and Micro LEDs, as current-driven devices, require large current flowing capability, better device stability, and in-plane voltage (Vth) uniformity. A top gate type IGZO TFT or the like has a high mobility and is suitable as a current driving display circuit. In the fabrication process of the existing top gate type IGZO TFT, a surface of the IGZO will be in contact with a photoresist and more organic solvent, so that a contact surface between the active layer of the IGZO and a gate insulating layer has more defects, which affects the stability of the device in subsequent operations.

SUMMARY OF THE INVENTION

An object of the present disclosure is to provide a manufacturing method of a thin film transistor substrate. A first insulating layer is deposited before a metal oxide semiconductor layer is patterned, so the first insulating layer can protect it, such that defects on a contact surface between an active layer and a gate insulating layer are reduced, thereby improving the stability of a device.

Another object of the present disclosure is to provide a thin film transistor substrate. A first insulating layer is deposited before a metal oxide semiconductor layer is patterned, so the first insulating layer can protect it, such that defects on a contact surface between an active layer and a gate insulating layer are reduced, thereby improving the stability of a device.

In order to achieve the above objects, the present disclosure provides a manufacturing method of a thin film transistor substrate, including the following steps.

step S1, providing a substrate, and sequentially depositing a buffer layer, a metal oxide semiconductor layer, and a first insulating layer on the substrate, and patterning the first insulating layer and the metal oxide semiconductor layer according to a pattern of an active layer. The metal oxide semiconductor layer forms the active layer.

step S2, sequentially depositing a second insulating layer and a gate metal layer on the first insulating layer and the buffer layer, and patterning the gate metal layer, the second insulating layer, and the first insulating layer. The gate metal layer forms a gate, and the first insulating layer and the second insulating layer together form a gate insulating layer below the gate.

The manufacturing method of the thin film transistor substrate further including:

step S3, depositing an interlayer dielectric layer on the gate, the active layer, and the buffer layer, and patterning the interlayer dielectric layer, and forming a first via hole and a second via hole on the interlayer dielectric layer. The first via hole and the second via hole are respectively disposed above two ends of the active layer.

step S4, depositing a source and drain metal layer on the interlayer dielectric layer, and patterning the source and drain metal layer to obtain a source and a drain that are in contact with the both ends of the active layer through the first via hole and the second via hole, respectively.

step S5, depositing a passivation layer on the interlayer dielectric layer, the source, and the drain, patterning the passivation layer, forming a third via hole on the passivation layer above the drain, and forming a pixel electrode on the passivation layer. The pixel electrode is in contact with the drain through the third via hole.

In the step S1, material of the first insulating layer includes silicon oxide, and a thickness of the first insulating layer ranges from 100 Å to 2000 Å.

In the step S1, material of the metal oxide semiconductor layer includes indium gallium zinc oxide, indium gallium tin oxide, or indium gallium zinc tin oxide.

In the step S1, the first insulating layer is patterned by a dry etching method, and then a remaining first insulating layer serves as a shielding layer. The metal oxide semiconductor layer is patterned by a wet etching method, and the active layer is formed from the metal oxide semiconductor layer.

In the step S1, the first insulating layer is formed by a plasma-enhanced chemical vapor deposition process.

The present disclosure also provides a thin film transistor substrate, including a substrate, a buffer layer disposed on the substrate, an active layer disposed on the buffer layer, a gate insulating layer disposed on the active layer, and a gate correspondingly disposed on the gate insulating layer.

The active layer is formed by patterning a metal oxide semiconductor layer.

The gate insulating layer is formed by patterning an insulating material layer, and the insulating material layer includes a first insulating layer and a second insulating layer.

The first insulating layer is deposited on the metal oxide semiconductor layer before the active layer is formed.

The second insulating layer is deposited on the first insulating layer and the buffer layer after the active layer is formed.

The thin film transistor substrate includes an interlayer dielectric layer, a source, a drain, a passivation layer, and a pixel electrode. The interlayer dielectric layer is disposed on the gate, the active layer, and the buffer layer. The source and the drain are disposed on the interlayer dielectric layer. The passivation layer is disposed on the interlayer dielectric layer, the source, and the drain. The pixel electrode is disposed on the passivation layer.

The interlayer dielectric layer is provided with a first via hole and a second via hole above two ends of the active layer.

The source and the drain are in contact with the two ends of the active layer through the first via hole and the second via hole, respectively.

The passivation layer is provided with a third via hole above the drain.

The pixel electrode is in contact with the drain through the third via hole.

Material of the first insulating layer includes silicon oxide, and a thickness of the first insulating layer ranges from 100 Å to 2000 Å.

Material of the active layer includes indium gallium zinc oxide, indium gallium tin oxide, or indium gallium zinc tin oxide.

Advantages of the present disclosure are as follows. In the manufacturing method of the thin film transistor substrate of the present disclosure, the buffer layer, the metal oxide semiconductor layer, and the first insulating layer are sequentially deposited on the substrate, and then the first insulating layer and the metal oxide semiconductor layer are patterned according to the pattern of the active layer. The metal oxide semiconductor layer forms the active layer. The second insulating layer and the gate metal layer are then sequentially deposited. The gate metal layer, the second insulating layer, and first insulating layer are patterned by a top gate self-aligned technology. The gate metal layer forms the gate, and the first insulating layer and the second insulating layer together form the gate insulating layer. The first insulating layer is deposited before the metal oxide semiconductor layer is patterned, so the first insulating layer can be used to protect the metal oxide semiconductor layer, such that defects on a contact surface between the active layer and the gate insulating layer are reduced, thereby improving the stability of a device. The thin film transistor substrate of the present disclosure includes the substrate, the buffer layer, the active layer, the gate insulating layer, and the gate. The active layer is formed by patterning the metal oxide semiconductor layer. The gate insulating layer is formed by a patterned insulating material layer including the first insulating layer and the second insulating layer. The first insulating layer is deposited on the metal oxide semiconductor layer before being patterned to form the active layer, so that the first insulating layer can be used to protect the metal oxide semiconductor layer. Thus, defects on a contact surface between the active layer and the gate insulating layer are reduced, and the stability of a device is increased.

BRIEF DESCRIPTION OF THE SEVERAL VIEWS OF THE DRAWINGS

The technical solution, as well as other beneficial advantages, of the present invention will be apparent from the following detailed description of embodiments of the present invention, with reference to the attached drawing.

In the drawing.

DESCRIPTION OF SPECIFIC EMBODIMENTS OF THE INVENTION

To further expound the technical solution adopted in the present disclosure and the advantages thereof, a detailed description is given to preferred embodiments of the present disclosure and the attached drawings.

Figure 1:
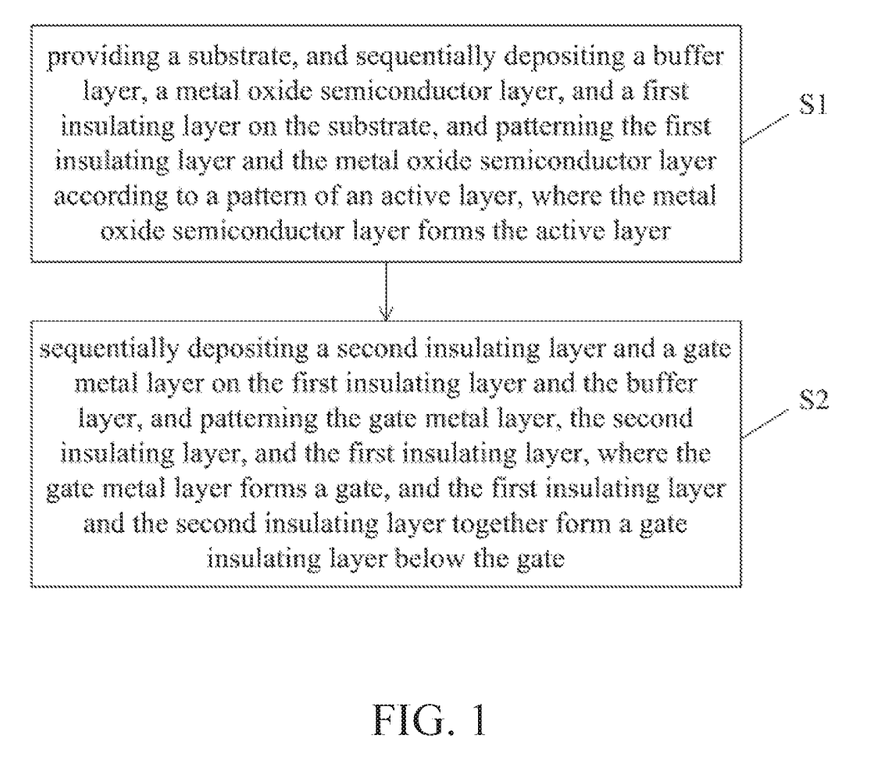
FIG. 1 is a flowchart of a manufacturing method of a thin film transistor substrate of the present disclosure.

Referring to FIG. 1, the present disclosure provides a manufacturing method of a thin film transistor substrate, including the following steps.

Figure 2:
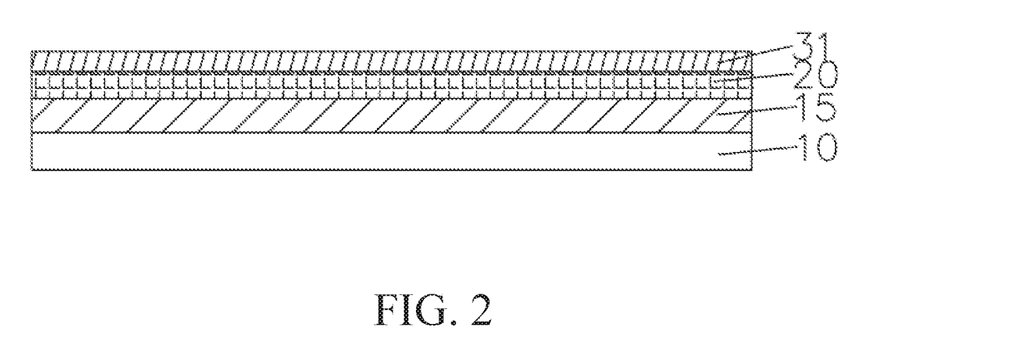
FIG. 2 and FIG. 3 are schematic diagrams showing a step S1 of the manufacturing method of the thin film transistor substrate of the present disclosure.
Figure 3:
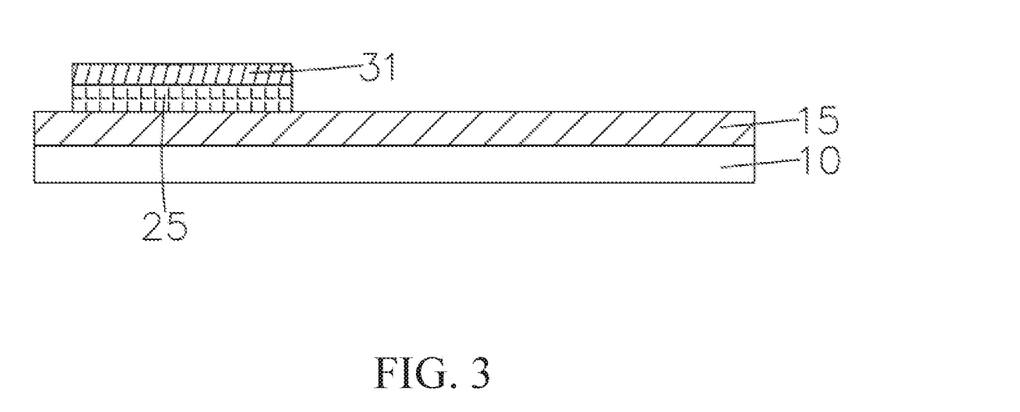

In a step S1, as shown in FIG. 2 and FIG. 3, a substrate 10 is provided. A buffer layer 15, a metal oxide semiconductor layer 20, and a first insulating layer 31 are sequentially deposited on the substrate 10. The first insulating layer 31 and the metal oxide semiconductor layer 20 are patterned according to a pattern of an active layer. The metal oxide semiconductor layer 20 forms the active layer 25.

Specifically, in the step S1, the buffer layer 15 formed on the substrate 10 may be a silicon oxide (SiOx) layer, a silicon nitride (SiNx) layer, or a laminated combination of the two.

Specifically, in the step S1, material of the first insulating layer 31 includes a silicon oxide having a thickness of 100 Å to 2000 Å. The first insulating layer 31 serves as a protective layer of the metal oxide semiconductor layer 20 in a semiconductor process, so that an upper surface of the metal oxide semiconductor layer 20 can be prevented from being in contact with a photoresist, an organic solution, acid and alkali, and the like.

Specifically, in the step S1, material of the deposited metal oxide semiconductor layer 20 may be a metal oxide semiconductor material such as indium gallium zinc oxide (IGZO), indium gallium tin oxide (IGTO), or indium gallium zinc tin oxide (IGZTO).

Specifically, in the step S1, the first insulating layer 31 is firstly patterned by using a dry etching method, and only a portion of the first insulating layer 31 corresponding to the pattern of the active layer is remained, and then the metal oxide semiconductor layer 20 is patterned by using a wet etching method. The metal oxide semiconductor layer 20 forms the active layer 25.

Specifically, in the step S1, the first insulating layer 31 may be formed by being subjected to a plasma-enhanced chemical vapor deposition (PECVD) process, an atomic layer deposition (ALD) method, or a physical vapor deposition (PVD) method, preferably, the PECVD process is employed.

Figure 4:
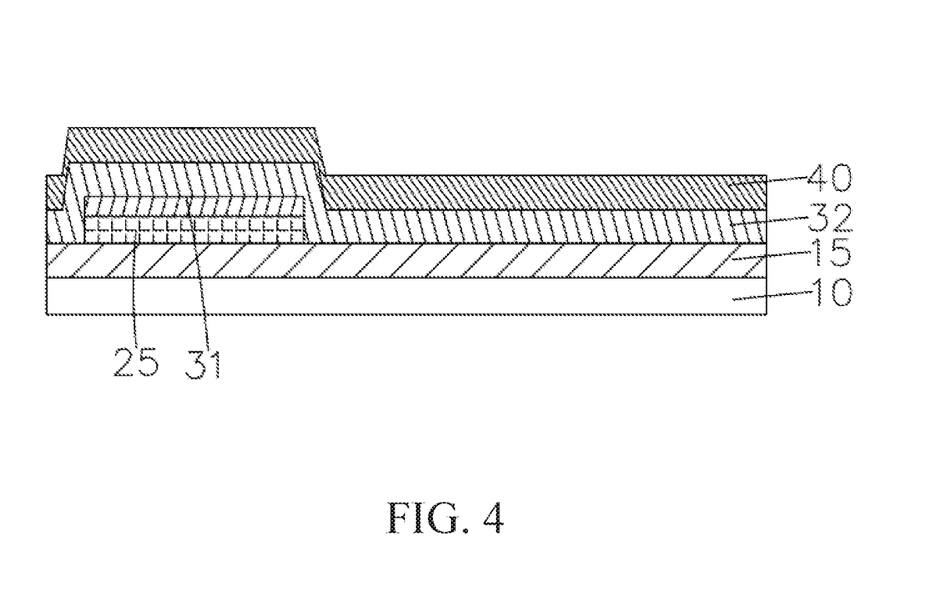
FIG. 4 and FIG. 5 are schematic diagrams showing a step S2 of the manufacturing method of the thin film transistor substrate of the present disclosure.
Figure 5:
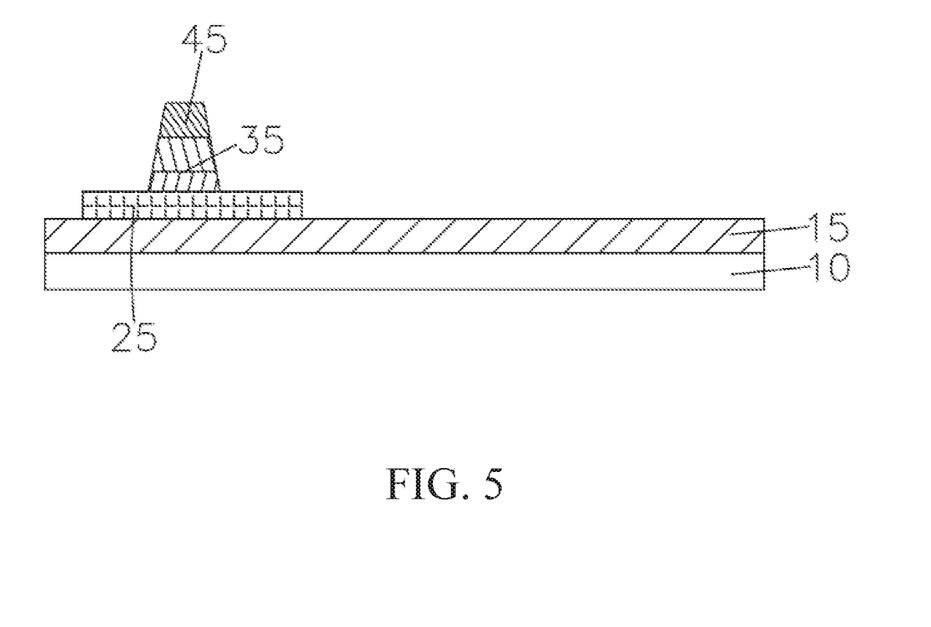

In a step S2, as shown in FIG. 4 and FIG. 5, a second insulating layer 32 and a gate metal layer 40 are sequentially deposited on the first insulating layer 31 and the buffer layer 15. The gate metal layer 40, the second insulating layer 32, and the first insulating layer 31 are patterned by a top gate self-aligned technology. The gate metal layer 40 forms a gate 45, and the first insulating layer 31 and the second insulating layer 32 together form a gate insulating layer 35 below the gate 45.

Specifically, in the step S2, material of the formed second insulating layer 32 may be silicon oxide or silicon nitride.

Specifically, in the step S2, material of the gate metal layer 40 is selected from the group consisting of molybdenum (Mo), titanium (Ti), aluminum (Al), and copper (Cu).

Specifically, in the step S2, the second insulating layer 32 is formed by PECVD, ALD, or PVD deposition.

Figure 6:
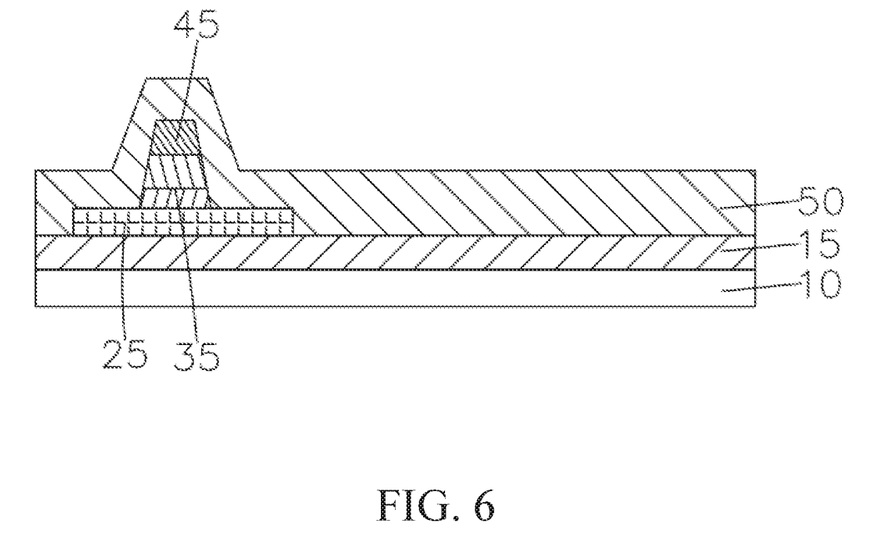
FIG. 6 and FIG. 7 are schematic diagrams showing a step S3 of the manufacturing method of the thin film transistor substrate of the present disclosure.
Figure 7:
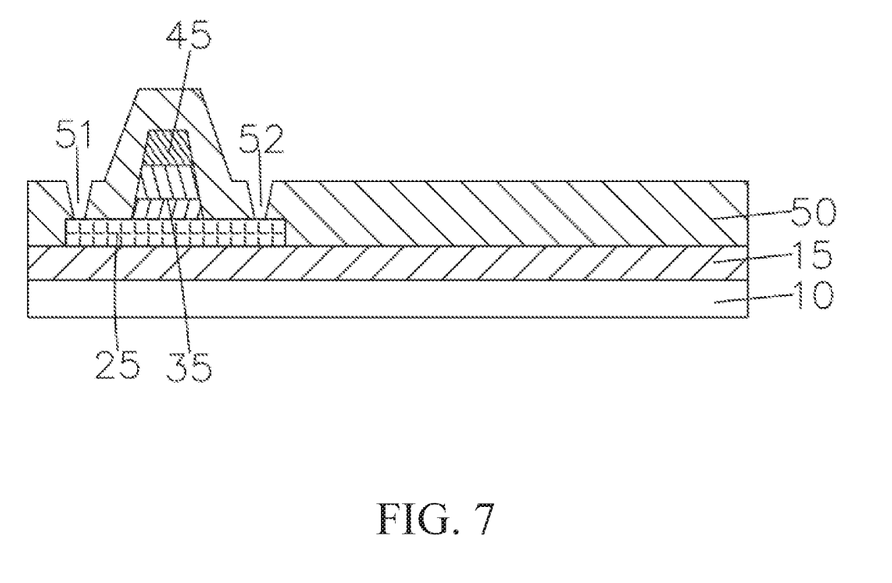

In a step S3, as shown in FIG. 6 and FIG. 7, an interlayer dielectric layer 50 is deposited on the gate 45, the active layer 25, and the buffer layer 15. The interlayer dielectric layer is patterned. A first via hole 51 and a second via hole 52 are formed on the interlayer dielectric layer 50, and the first via hole 51 and the second via hole 52 are respectively disposed above two ends of the active layer 25.

Specifically, in the step S3, the interface dielectric layer 50 may be a silicon oxide layer, a silicon nitride layer, or a laminated combination of the two.

Figure 8:
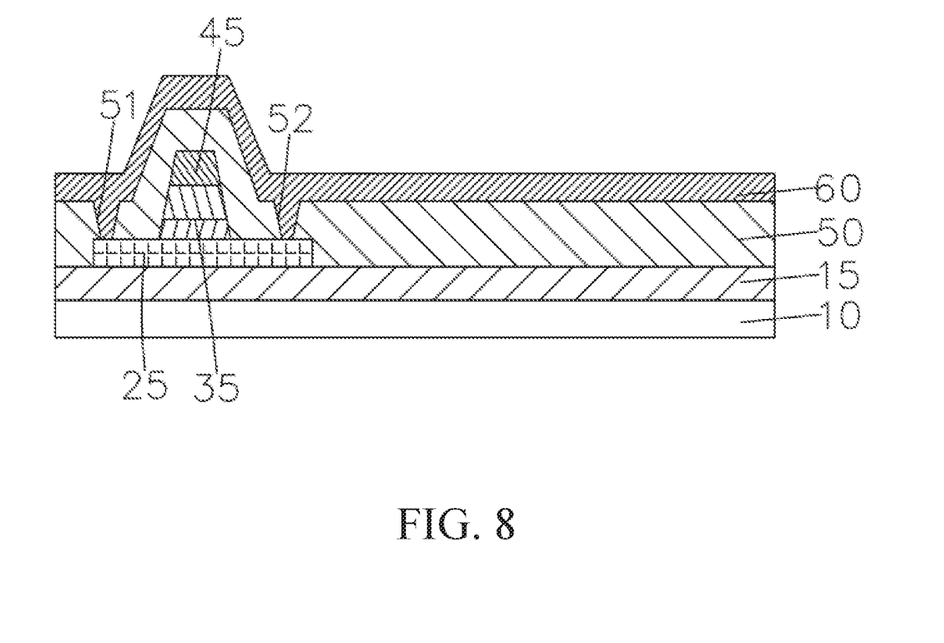
FIG. 8 and FIG. 9 are schematic diagrams showing a step S4 of the manufacturing method of the thin film transistor substrate of the present disclosure.
Figure 9:
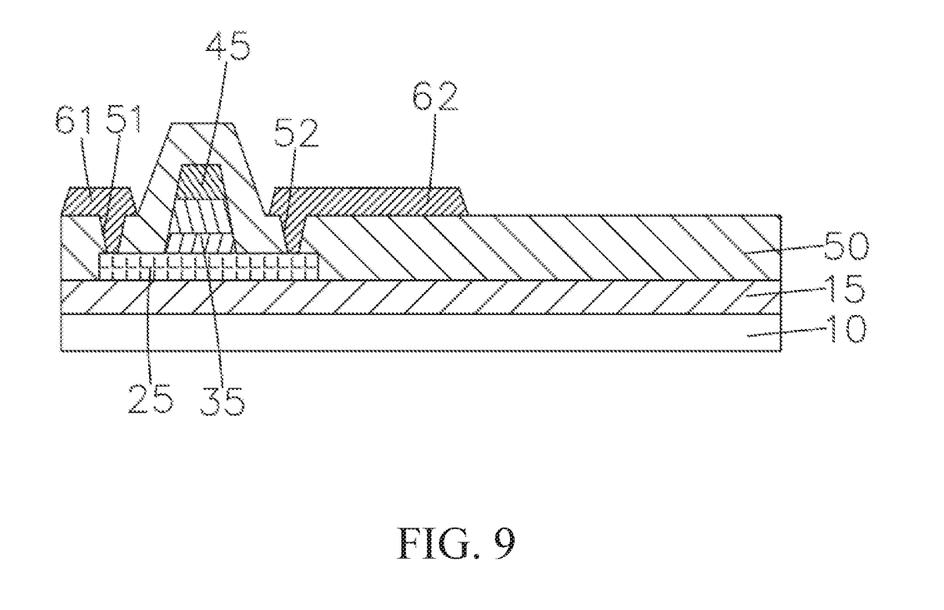

In a step S4, as shown in FIG. 8 and FIG. 9, a source and drain metal layer 60 is deposited on the interlayer dielectric layer 50. The source and drain metal layer 60 is patterned to obtain a source 61 and a drain 62 that are in contact with the both ends of the active layer 25 through the first via hole 51 and the second via hole 52, respectively.

Specifically, in the step S4, material of the source and drain metal layer 60 is selected from the group consisting of molybdenum, titanium, aluminum, and copper.

Figure 10:
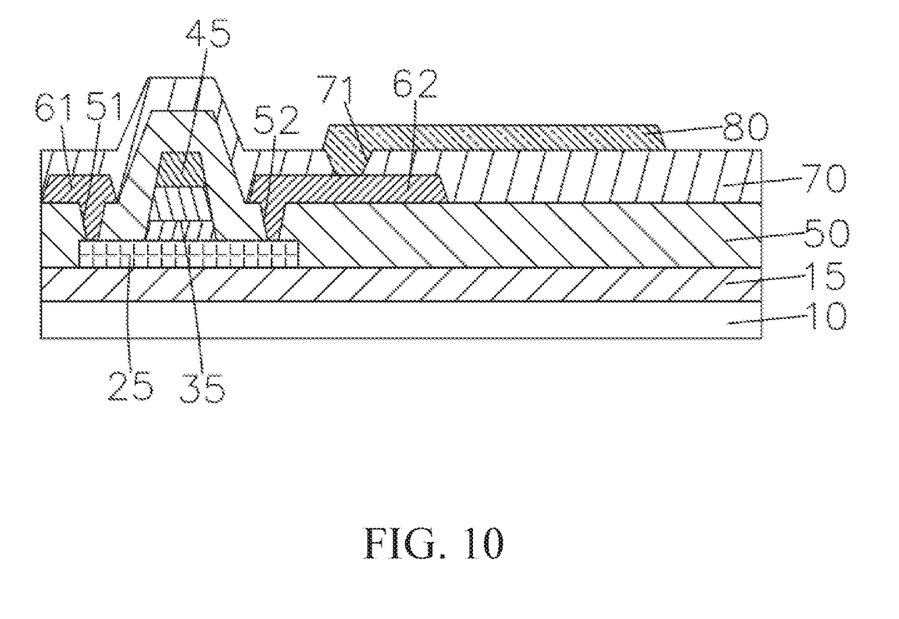
FIG. 10 is schematic diagrams showing a step S5 of the manufacturing method of the thin film transistor substrate of the present disclosure, and also showing the thin film transistor substrate of the present disclosure.

In a step S5, as shown in FIG. 10, a passivation layer 70 is deposited on the interlayer dielectric layer 50, the source 61, and the drain 62. The passivation layer 70 is patterned. A third via hole 71 is formed on the passivation layer 70 above the drain 62. A pixel electrode 80 is formed on the passivation layer 70. The pixel electrode 80 is in contact with the drain 62 through the third via hole 71.

Specifically, in the step S5, the passivation layer 70 may be a silicon oxide layer, a silicon nitride layer, or a laminated combination of the two. The pixel electrode 80 may be a transparent conductive film layer (such as indium tin oxide (ITO) or indium zinc oxide (IZO)) or a non-transparent conductive film layer (such as silver (Ag), tungsten (W), copper, titanium or the like).

In the manufacturing method of the thin film transistor substrate of the present disclosure, the buffer layer 15, the metal oxide semiconductor layer 20, and the first insulating layer 31 are sequentially deposited on the substrate 10, and then the first insulating layer 31 and the metal oxide semiconductor layer 20 are patterned according to the pattern of the active layer. The metal oxide semiconductor layer 20 forms the active layer 25. The second insulating layer 32 and the gate metal layer 40 are then sequentially deposited. The gate metal layer 40, the second insulating layer 32, and first insulating layer 31 are patterned by a top gate self-aligned technology. The gate metal layer 40 forms the gate, and the first insulating layer 31 and the second insulating layer 32 together form the gate insulating layer 35. The first insulating layer 31 is deposited before the metal oxide semiconductor layer 20 is patterned, so the first insulating layer 31 can be used to protect the metal oxide semiconductor layer 20, so that an upper surface of the metal oxide semiconductor layer 20 can be prevented from being in contact with an organic solution, acid and alkali, and the like in subsequent operations. Thus, defects on a contact surface between the active layer 25 and the gate insulating layer 35 are reduced, and the device is kept stable in positive bias temperature stress (PBTS) and negative bias temperature instability (NBTIS) tests, thereby improving the stability of the device.

Referring to FIG. 10, based on the manufacturing method of the thin film transistor substrate described above, the present disclosure further provides a thin film transistor substrate. The thin film transistor substrate includes a substrate 10, a buffer layer 15, an active layer 25, a gate insulating layer 35, a gate 45, an interlayer dielectric layer 50, a source 61, a drain 62, a passivation layer 70, and a pixel electrode 80. The buffer layer 15 is disposed on the substrate 10. The active layer 25 is disposed on the buffer layer 15. The gate insulating layer 35 is disposed on the active layer 25. The gate 45 correspondingly disposed on the gate insulating layer 35. The interlayer dielectric layer 50 is disposed on the gate 45, the active layer 25, and the buffer layer 15. The source 61 and the drain 62 are disposed on the interlayer dielectric layer 50. The passivation layer 70 is disposed on the interlayer dielectric layer 50, the source 61, and the drain 62. The pixel electrode 80 is disposed on the passivation layer 70.

Specifically, the active layer 25 is formed by patterning a metal oxide semiconductor layer.

Specifically, the gate insulating layer 35 is formed by patterning an insulating material layer. The insulating material layer includes a first insulating layer 31 and a second insulating layer 32. Before the active layer 25 is formed, the first insulating layer 31 is deposited on the metal oxide semiconductor layer. After the active layer 25 is formed, the second insulating layer 32 is deposited on the first insulating layer 31 and the buffer layer 15.

Specifically, a first via hole 51 and a second via hole 52 are formed on the interlayer dielectric layer 50, and the first via hole 51 and the second via hole 52 are respectively disposed above two ends of the active layer 25. The source 61 and the drain 62 are in contact with the both ends of the active layer 25 through the first via hole 51 and the second via hole 52, respectively.

Specifically, a third via hole 71 is formed on the passivation layer 70 above the drain 62. The pixel electrode 80 is in contact with the drain 62 through the third via hole 71.

Specifically, material of the first insulating layer 31 may be silicon oxide, and a thickness of the first insulating layer 31 ranges from 100 Å to 2000 Å.

Specifically, material of the active layer 25 may be a metal oxide semiconductor material such as indium gallium zinc oxide, indium gallium tin oxide, or indium gallium zinc tin oxide.

Specifically, the buffer layer 15 may be a silicon oxide layer, a silicon nitride layer, or a laminated combination of the two.

Specifically, materials of the gate 45, the source 61, and the drain 62 are selected from the group consisting of molybdenum, titanium, aluminum, and copper.

Specifically, material of the second insulating layer 32 may be silicon oxide or silicon nitride.

Specifically, the interlayer dielectric layer 50 may be a silicon oxide layer, a silicon nitride layer, or a laminated combination of the two.

Specifically, the passivation layer 70 may be a silicon oxide layer, a silicon nitride layer, or a laminated combination of the two. The pixel electrode 80 may be a transparent conductive film layer (such as indium tin oxide or indium zinc oxide) or a non-transparent conductive film layer (such as silver, tungsten, copper, titanium or the like).

In the thin film transistor substrate of the present disclosure, the active layer 25 is formed by patterning the metal oxide semiconductor layer. The gate insulating layer 35 is formed by patterning an insulating material layer including the first insulating layer 31 and the second insulating layer 32. Before the active layer 25 is formed, the first insulating layer 31 is deposited on the metal oxide semiconductor layer. Thus, the metal oxide semiconductor layer can be protected by the first insulating layer 31, so that defects on a contact surface between the active layer 25 and the gate insulating layer 35 are reduced, and the stability of a device is increased.

In summary, in the manufacturing method of the thin film transistor substrate of the present disclosure, the buffer layer, the metal oxide semiconductor layer, and the first insulating layer are sequentially deposited on the substrate, and then the first insulating layer and the metal oxide semiconductor layer are patterned according to the pattern of the active layer. The metal oxide semiconductor layer forms the active layer. The second insulating layer and the gate metal layer are then sequentially deposited. The gate metal layer, the second insulating layer, and first insulating layer are patterned by a top gate self-aligned technology. The gate metal layer forms the gate, and the first insulating layer and the second insulating layer together form the gate insulating layer. The first insulating layer is deposited before the metal oxide semiconductor layer is patterned, so the first insulating layer can be used to protect the metal oxide semiconductor layer, such that defects on a contact surface between the active layer and the gate insulating layer are reduced, thereby improving the stability of a device. The thin film transistor substrate of the present disclosure includes the substrate, the buffer layer, the active layer, the gate insulating layer, and the gate. The active layer is formed by patterning the metal oxide semiconductor layer. The gate insulating layer is formed by a patterned insulating material layer including the first insulating layer and the second insulating layer. The first insulating layer is deposited on the metal oxide semiconductor layer before being patterned to form the active layer, so that the first insulating layer can be used to protect the metal oxide semiconductor layer. Thus, defects on a contact surface between the active layer and the gate insulating layer are reduced, and the stability of a device is increased.

Based on the description given above, those having ordinary skills of the art may easily contemplate various changes and modifications of the technical solution and technical ideas of the present disclosure and all these changes and modifications are considered within the protection scope defined by the claims of the present disclosure.

What is claimed is:

1. A manufacturing method of a thin film transistor substrate, comprising steps as follows:

step S1, providing a substrate, and sequentially depositing a buffer layer, a metal oxide semiconductor layer, and a first insulating layer on the substrate, and patterning the first insulating layer and the metal oxide semiconductor layer according to a pattern of an active layer, wherein the metal oxide semiconductor layer forms the active layer, and wherein in the step S1, the first insulating layer is patterned by a dry etching method, and then a remaining first insulating layer serves as a shielding layer, the metal oxide semiconductor layer is patterned by a wet etching method, and the active layer is formed from the metal oxide semiconductor layer; and step S2, sequentially depositing a second insulating layer and a gate metal layer on the first insulating layer and the buffer layer, and patterning the gate metal layer, the second insulating layer, and the first insulating layer, wherein the gate metal layer forms a gate, and the first insulating layer and the second insulating layer together form a gate insulating layer below the gate.

2. The manufacturing method of the thin film transistor substrate as claimed in claim 1, further comprising:

step S3, depositing an interlayer dielectric layer on the gate, the active layer, and the buffer layer, and patterning the interlayer dielectric layer, and forming a first via hole and a second via hole on the interlayer dielectric layer, wherein the first via hole and the second via hole are respectively disposed above two ends of the active layer;

step S4, depositing a source and drain metal layer on the interlayer dielectric layer, and patterning the source and drain metal layer to obtain a source and a drain that are in contact with the both ends of the active layer through the first via hole and the second via hole, respectively; and step S5, depositing a passivation layer on the interlayer dielectric layer, the source, and the drain, patterning the passivation layer, forming a third via hole on the passivation layer above the drain, and forming a pixel electrode on the passivation layer, wherein the pixel electrode is in contact with the drain through the third via hole.

3. The manufacturing method of the thin film transistor substrate as claimed in claim 1, wherein in the step S1, material of the first insulating layer comprises silicon oxide, and a thickness of the first insulating layer ranges from 100 Å to 2000 Å.

4. The manufacturing method of the thin film transistor substrate as claimed in claim 1, wherein in the step S1, material of the metal oxide semiconductor layer comprises indium gallium zinc oxide, indium gallium tin oxide, or indium gallium zinc tin oxide.

5. The manufacturing method of the thin film transistor substrate as claimed in claim 1, wherein in the step S1, the first insulating layer is formed by a plasma-enhanced chemical vapor deposition process.

* * * * *